(12) United States Patent
Chi (10) Patent No.: US 6,501,109 B1
(45) Date of Patent: Dec. 31, 2002

(54) ACTIVE CMOS PIXEL WITH EXPONENTIAL OUTPUT BASED ON THE GIDL MECHANISM

(75) Inventor: Min-Hwa Chi, Hsin-chu (TW)

(73) Assignee: Taiwan Semiconductor Manufacturing Company, Hsihn-chu (TW)

( * ) Notice: Subject to any disclaimer, the term of this patent is extended or adjusted under 35 U.S.C. 154(b) by 0 days.

(21) Appl. No.: 09/940,936

(22) Filed: Aug. 29, 2001

(51) Int. Cl.[7] .......................... H01L 27/148; H01L 31/00
(52) U.S. Cl. ...................... 257/223; 257/230; 257/291; 257/292; 257/444; 257/445; 257/461; 257/462; 257/423
(58) Field of Search ................................ 257/223, 230, 257/291, 292, 444, 445, 461, 462, 423

(56) References Cited

U.S. PATENT DOCUMENTS

| | | | |
|---|---|---|---|
| 4,360,821 A | * 11/1982 | Tsukada et al. ................ 357/31 |
| 5,260,592 A | 11/1993 | Mead et al. ................. 257/291 |
| 5,349,216 A | * 9/1994 | Lee et al. .................... 257/230 |
| 5,514,887 A | * 5/1996 | Hokart ....................... 257/222 |
| 5,587,595 A | 12/1996 | Chi et al. .................... 257/223 |
| 5,608,243 A | 3/1997 | Chi et al. .................... 257/249 |
| 5,945,722 A | 8/1999 | Tsuei et al. .................. 257/440 |
| 5,952,686 A | 9/1999 | Chou et al. .................. 257/292 |
| 6,147,372 A | 11/2000 | Yang et al. .................. 257/232 |
| 6,307,195 B1 | * 10/2001 | Guidash .................. 250/208.1 |

OTHER PUBLICATIONS

"Gate–Induced Band–to–Band Tunneling Leakage Current in LDD MOSFETs", by Wann et al., IDEM '92, pp. 147–150.

"Comparison of GIDL in p+ –poly PMOS and n+ –poly PMOS Devices," by Lindert et al., IEEE DL, vol. 17, No. 6, Jun. 1996, pp. 285–287.

"Image Capture Circuits in CMOS," Proceedings of International Conference on VLSI–Technology, Systems and Applications; Taipei, 1997.

T. Chan, J. Chen, P. Ko, C. Hu, "The Impact of Gate–Induced Drain Leakage Current on MOSFET Scaling," IEDM Tech. Digest, pp. 718–721, 1987.

"A High Resolution CMOS Imager with Active Pixel using Capacitively Coupled Bipolar Operation," by Chi et al., Paper B@,Proceedings of Int'l Conf. on VLSI–Tech., Systems and Applications; Taipei, 1997.

* cited by examiner

*Primary Examiner*—George Eckert
*Assistant Examiner*—Joseph Nguyen
(74) *Attorney, Agent, or Firm*—George O. Saile; Stephen B. Ackerman (57) ABSTRACT

A structure of a new active pixel sensor cell formed in a semiconductor substrate is disclosed. An n-type region is formed in the substrate extending to the surface. Two p+ regions are formed in the n-type region, both extending to the surface and covering almost all the active area of the new active pixel sensor cell. The p+ region forming the p+ node of the photodiode has a substantially larger surface area than the p+ region forming the p+ node of the output diode. Isolation regions are formed over those portions of the new active pixel cell periphery that will not be adjacent to other new active pixel sensor cells. A polysilicon floating gate is disposed over a dielectric layer formed over the surface. The floating gate overlaps portions of both p+ regions and the floating gate is connected to photodiode p+ region by a conducting region passing through the dielectric layer. A control gate is disposed over the photodiode p+ region and over the floating gate and is separated from the photodiode p+ region and the floating gate by dielectric layers. A metal layer, disposed over a dielectric layer, is connected to the output diode p+ region by a conductive region passing through the dielectric layers.

68 Claims, 8 Drawing Sheets

ACTIVE CMOS PIXEL WITH EXPONENTIAL OUTPUT BASED ON THE GIDL MECHANISM

BACKGROUND OF THE INVENTION

(1) Field of the Invention

The present invention relates generally to semiconductor integrated circuit technology and more particularly to active pixel sensor (APS) technology.

(2) Description of Prior Art

There are two major categories of APS: active CMOS pixels and active bipolar pixels. Conventional active CMOS pixels are discussed by Fossum in paper B1, Proceedings of International Conference on VLSI—technology, systems and applications; Taipei, 1997. Active bipolar pixels are described in Mead, U.S. Pat. No. 5,260,592 and in Chi et al., paper B2, Proceedings of International Conference on VLSI—technology, systems and applications; Taipei, 1997. The active bipolar pixel size is about 5 times smaller than the active CMOS pixel, but there are blooming and image-lag limitations.

Figure 1:
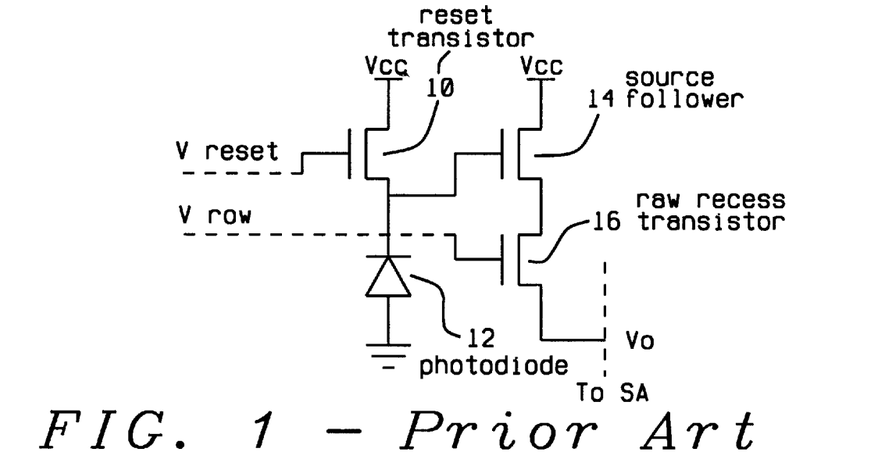
FIG. 1 shows a conventional active CMOS pixel.

A popular conventional active pixel based on CMOS, shown in FIG. 1, contains one photo-diode and three n-channel MOS transistors (for reset, source follower, and row access). The "reset transistor", 10, is used for resetting the potential of the floating-node of photo-diode 12 to $V_{cc}$. The floating-node of the photo-diode is connected to the gate of "source follower" 14, where its conductance is modulated by the floating-node potential. After reset operation, the potential of photo-diode is modulated (decreasing) by accumulating electrons generated by image light (or photons) during the "image integration" period. After turning on the row access transistor, 16, Vo is read out (one $V_T$ below the floating-node potential) as the output of the image signal. The output is essentially linear with the photo-signal (i.e. floating-node potential). In short, one basic CMOS pixel needs one diode (for light collection) and 3 transistors for implementing functions of reset, image integration, and read (or sensing).

Figure 2A:
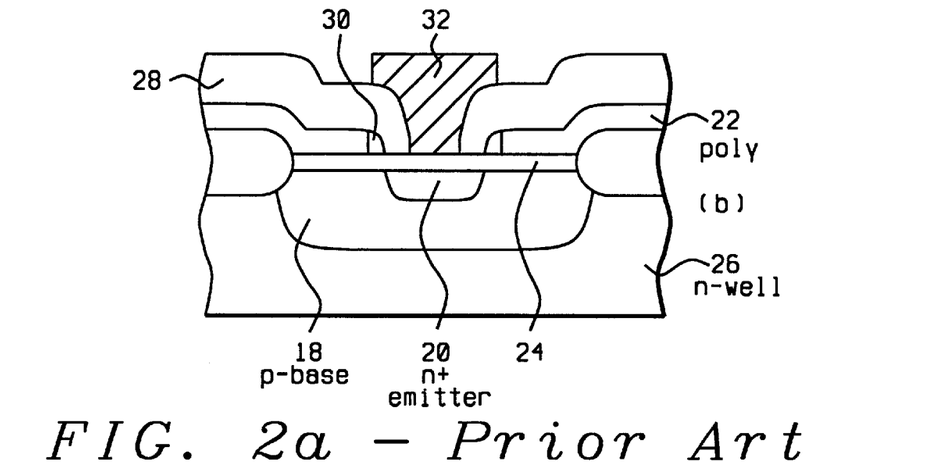
FIGS. 2a and 2b show a conventional active bipolar pixel.
Figure 2B:
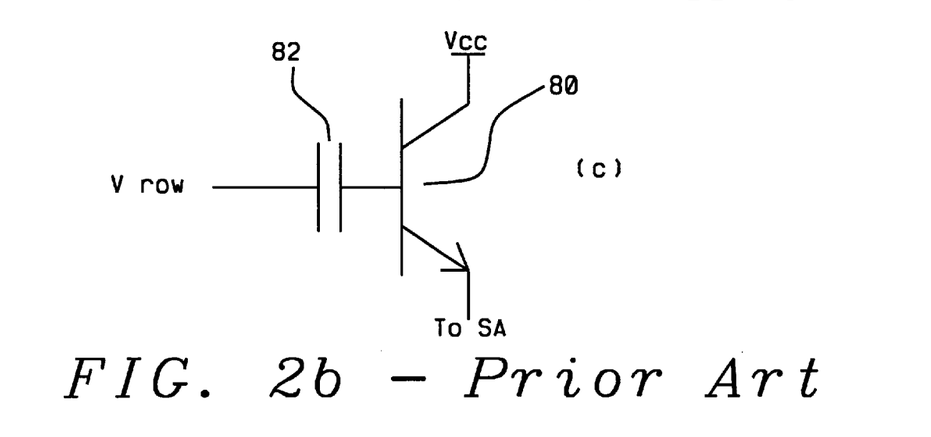

A popular conventional bipolar active pixel, shown in FIGS. 2a and 2b, contains a vertical bipolar (npn) transistor, 8o, with a capacitor, 82, coupled to the base, as is indicated in FIG. 2b. It has simple layout and can be fabricated by typical CMOS technology processing (FIG. 2b). The p base, 18, to n+ emitter, 20, junction is used for collecting image light (or photons), and the n-well region 26 is the transistor's collector region. The base coupled capacitor is simply a gate capacitor formed between the poly, 22, and the p-base, 18, across the gate oxide layer, 24. It is used for switching the base potential toward reverse-bias for "image integration" and forward-bias with respect to the emitter for "read" operation. Region 28 is a dielectric layer, region 30 is dielectric spacers as used in LDD structures of CMOS transistors and 32 is a metal region providing contact to the emitter. The charge generated by photons during image integration period is amplified by the bipolar action during a read (or sensing) period and collected by the column (charge) sense amplifier (SA). The output of such a bipolar active pixel, which is the bipolar amplified charge generated by photons, is also essentially linear with the photo-signal (i.e. the floating p-base potential. The active bipolar pixel is known to have more image-lag and blooming limitations and is more useful for high resolution still photography. As a comparison, the CMOS active pixel has much less blooming and image-lag problems although its pixel size is about 5 times larger than that of an active bipolar pixel.

Chi et al., in U.S. Pat. Nos. 5,587,596 and 5,68,243, describe single transistor active pixel sensor cells that provide automatic anti-blooming and wide dynamic range, and reduce the size of conventional active pixel cells. U.S. Pat. No. 5,952,686 to Chou et al. provides a salient integration mode active pixel sensor that is compatible with CMOS fabrication processes. A color active pixel sensor cell with oxide color filters is disclosed in U.S. Pat. No. 5,945,722 to Tsui et al. Layouts that increase the photon induced current of metal oxide semiconductor image sensors are described by Yang et al. in U.S. Pat. No. 6,147,372.

SUMMARY OF THE INVENTION

It is a primary objective of the invention to provide a new type of active pixel structure that uses a gated junction's gate-induced-drain-leakage (GIDL) current, which is triggered by band-to-band tunneling, as the sensing mechanism. It is also a primary objective to provide a method to fabricate these new structures.

The new pixel has one photo-diode for light collection, usually the larger in area, and one floating-gated output diode for output GIDL current to a SA for sensing the current. The floating-gate (poly-1) is connected to the floating-node of the photo-diode. Thus, the potential of the floating-gate (and floating-node) represents the image photo-signal, which has exponential effect on the output GIDL current to SA. A control-gate (poly-2), which is coupled to the floating-gate, provides switching capabilities to all operations (for reset, integration, and read) of the new pixel. The new pixel has small size, good anti-blooming and image-lag performance, and, for the first time, is capable of exponential output (i.e. GIDL current) with respect to the photo-signal (i.e. the floating-node potential).

A structure of a new active pixel sensor cell formed in a semiconductor substrate is disclosed. An n-type region is formed in the substrate extending to the surface. Two p+ regions are formed in the n-type region, both extending to the surface and covering almost all the active area of the new active pixel sensor cell. The p+ region forming the p+ node of the photodiode has a substantially larger surface area than the p+ region forming the p+ node of the output diode. Isolation regions are formed over those portions of the new active pixel cell periphery that will not be adjacent to other new active pixel sensor cells. A polysilicon floating gate is disposed over a dielectric layer formed over the surface. The floating gate overlaps portions of both p+ regions and the floating-gate is connected to photodiode p+ region by a conducting region passing through the dielectric layer. A control gate is disposed over the photodiode p+ region and over the floating-gate and is separated from the photodiode p+ region and the floating-gate by dielectric layers. A metal layer, disposed over a dielectric layer, is connected to the output diode p+ region by a conductive region passing through the dielectric layers.

BRIEF DESCRIPTION OF THE DRAWINGS

In the accompanying drawing forming a material part of this description, there is shown.

DESCRIPTION OF THE PREFERRED EMBODIMENTS

Figure 3A:
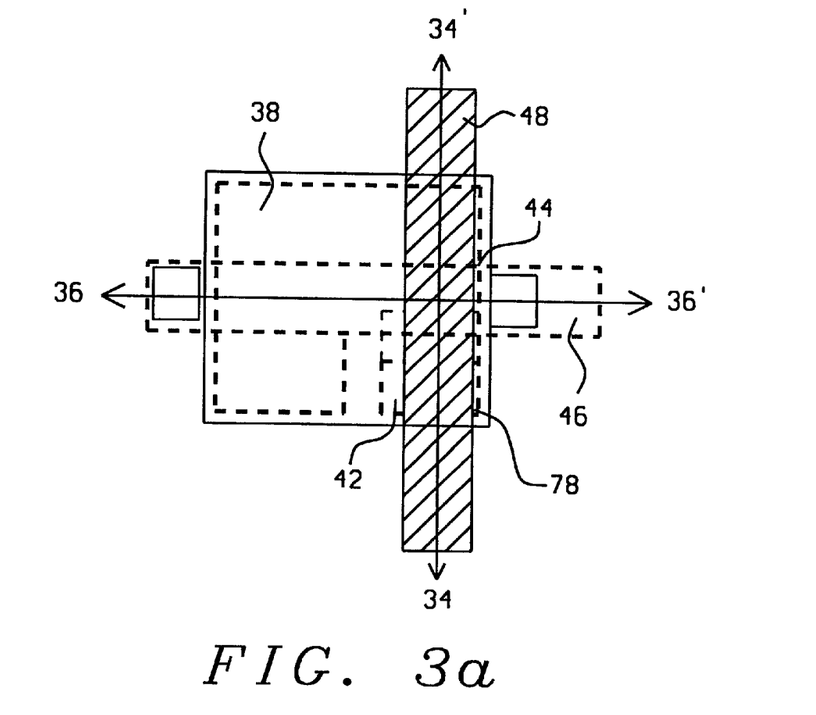
FIGS. 3a, 3b and 3c show a layout and cross-sections of a pixel structure according to the invention.
Figure 3B:
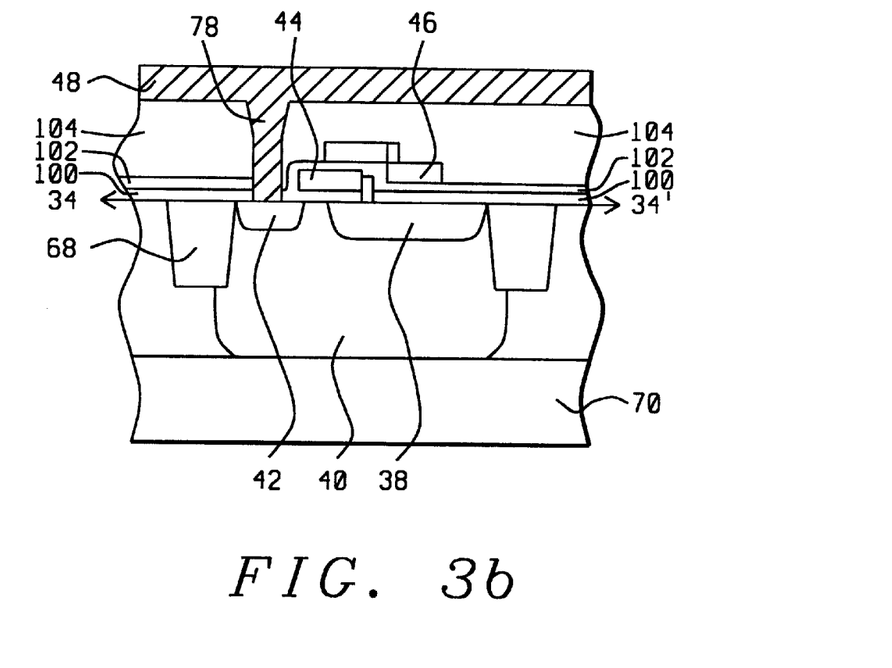
Figure 3C:
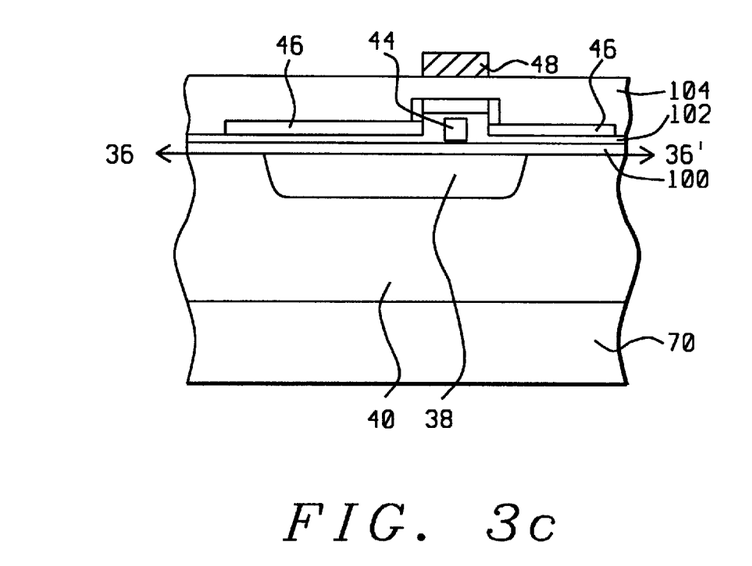

The structure of a preferred embodiment of the new pixel type is shown in FIGS. 3a, 3b and 3c. The layout is depicted in FIG. 3a and cross-sections along 34–34' and 36–36' are shown in FIGS. 3b and 3c, respectively. An n-well, 40 is formed in a p-substrate, 70 and isolation is achieved using shallow trench isolation, 68. There are two diodes in each pixel. The larger diode is the photo-diode, formed by the larger p+ region 38 and the n-well 40, and is used for capturing image light (or photons). The smaller diode is the gated output diode formed by the smaller p+ region 42 and the n-well 40. It has a floating-gate, 44, that is disposed over a first dielectric layer, 100, which is formed over the semiconductor surface. The floating-gate is shorted to the p+ floating-node of photo-diode, 38, through the first dielectric layer. The potential of the floating-node, and thus also the floating-gate, varies with the image light intensity and represents the "photo-signal". The floating-gate potential has a strong (exponential) effect on the magnitude of "GIDL" current generated on the surface of the p+ node of the output diode. GIDL currents are described in Wann et al., IDEM '92 pp. 147-ISO and in Lindert et al. IEEE DL vol. 17, no.6 June 1996, pp.285–287. The p+ node of the output diode is connected to a metal line, 48, by a metal contact region 78, which passes through first dielectric layer, 100, second dielectric layer, 102, ands third dielectric layer, 104, and is clamped to the SA's reference voltage. The control-gate 46, is coupled to the floating-gate through a second dielectric layer, 102, and thus to the p+ node of the photo-diode, for switching the pixel into the basic operations of reset, image integration, and read.

For illustration, a typical new pixel based on 0.25 μm CMOS design rules will have the following features: The pixel size is about 4 μm×4 μm. The control-gate to floating-gate coupling ratio (γ) is about 0.5 for maximum dynamic range. Contact size is 0.3 μm×0.3 μm. The control-gate is silicided with minimum width of 0.4 μm for good conductance. The photo-diode area should not be silicided to avoid image light blocking by silicide. The output diode should also not have silicide since a silicide surface will prevent GIDL current generation. Furthermore, it is preferred to have the output diode area light shielded by metal atop.

Figure 4:
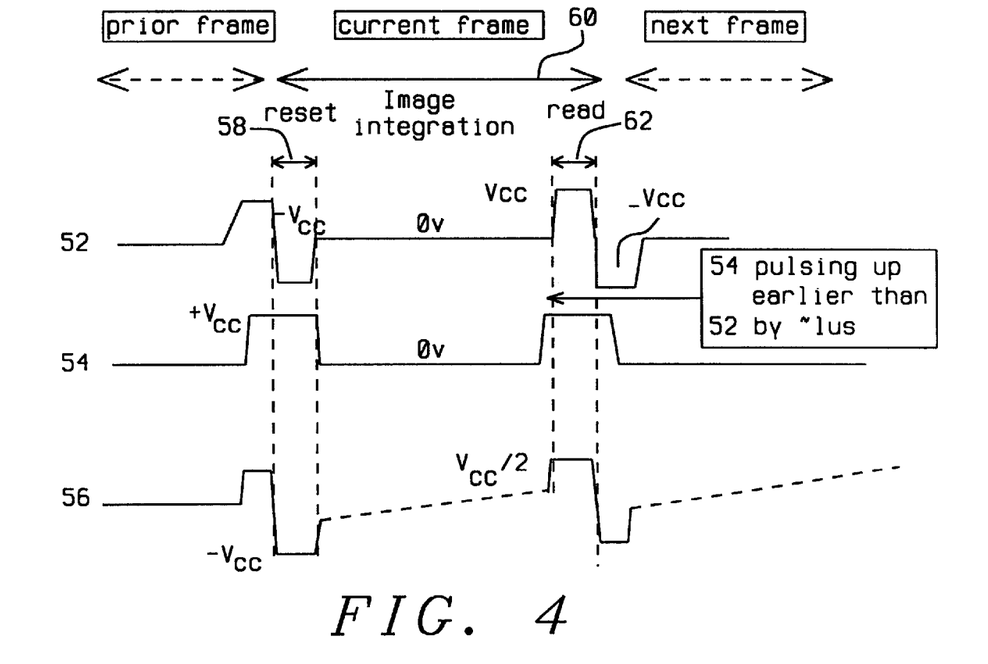
FIG. 4 shows a timing diagram of the basic operations; reset, image integration and read.

The timing diagrams of the basic operations, reset, image integration and read, are illustrated in FIG. 4. In practice pixels are used in arrays with the reset and read operations performed over the rows of the array. Voltage curves designated 52, 54 and 56 are the potentials $V_{cg}$, $V_{nw}$ and $V_{fg}$ of the control gate, n-well and floating gate respectively. The period, the time interval of each frame, is determined by the number of frames desired, e.g. if 24 frames per second is required, then the period is 41.67 msec. The time for read per row, 62, certainly depends on the imager array density, i.e. on the number of rows. For example, if there are 1028 rows in the array, then the read period is about 40.5 μsec or shorter. The time for reset, 60, can be adjusted to be longer or shorter, so that the signal integration time, 58, can be adjusted accordingly. In this way, it performs an electronic "shutter" function for controlling the amount of image light into the photo-diode for generating photo-signals. In today's digital CMOS technology, the circuit uses clocks with frequencies of up to 300 MHz or higher. Therefore, the frequency of the imager operation is slow, by a factor of about 1000, as compared with state-of-art digital circuits.

Figure 5A:
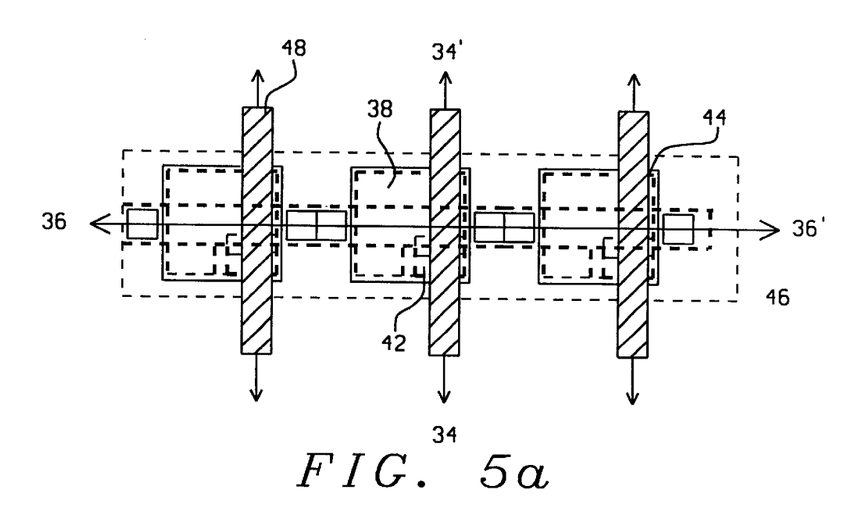
FIG. 5 shows a layout and cross-section of three pixels in a row.
Figure 5B:
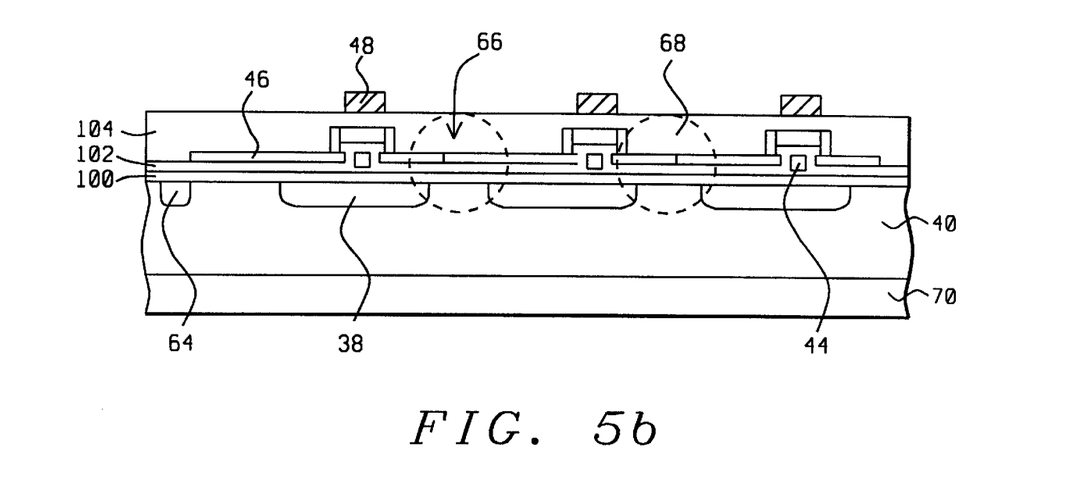

The reset operation of each row is shown in FIGS. 5a and 5b. There is shown, for illustration, three new pixels arranged in a row so that their control gates, 46 are connected to form a row control gate and the n-well is a single extended region for the entire row. There are parasitic p-MOS transistors, 66 formed in between adjacent p+ nodes of the photo-diodes, 38, underneath the row control-gate. The threshold voltage ($V_T$) of these parasitic p-MOS is designed to be small (e.g. –0.5 v) by using p-type doped polysilicon for the control-gate and a native n-well (i.e. no additional $V_T$ adjustment implant is performed into the n-well). Applying a negative bias generated on chip by charge pump, e.g. $-V_{cc}$, at the edge p+ junction, 64, of the row and pulsing the control-gate to $-V_{cc}$ can turn on the parasitic p-MOS transistors $V_{cc}$ is set negative enough by at least $V_T$ and therefore there is no $V_T$ drop across the parasitic p-MOS transistors. $V_{cc}$ is the external voltage supply of the chip and the negative charge pump on the chip can generate negative bias. $V_{cc}$ is about 2.5 volts for typical 0.25-micron CMOS digital circuits. The p+ nodes of all the photo-diodes in the row are then reset to $-V_{cc}$. The n-well is biased at $+V_{cc}$ in reset. After reset, the control-gate is pulsing back to 0 volts to turn off the parasitic p-MOS. The n-well is pulsed to 0 volts for anti-blooming. Anti-blooming is achieved by setting the p+ node of the photodiode at the highest potential (i.e. $+V_{cc}$) during integration. The p+ node potential is boosted higher by $\gamma V_{cc}$ (i.e. $0.5 V_{cc}$) as a result of capacitative coupling with the control-gate. The pixel is now ready for image integration. This reset operation by turning on the parasitic p-MOS transistors of a row has been previously proposed in U.S. Pat. No. 5,587,596 to Chi.

Figure 6:
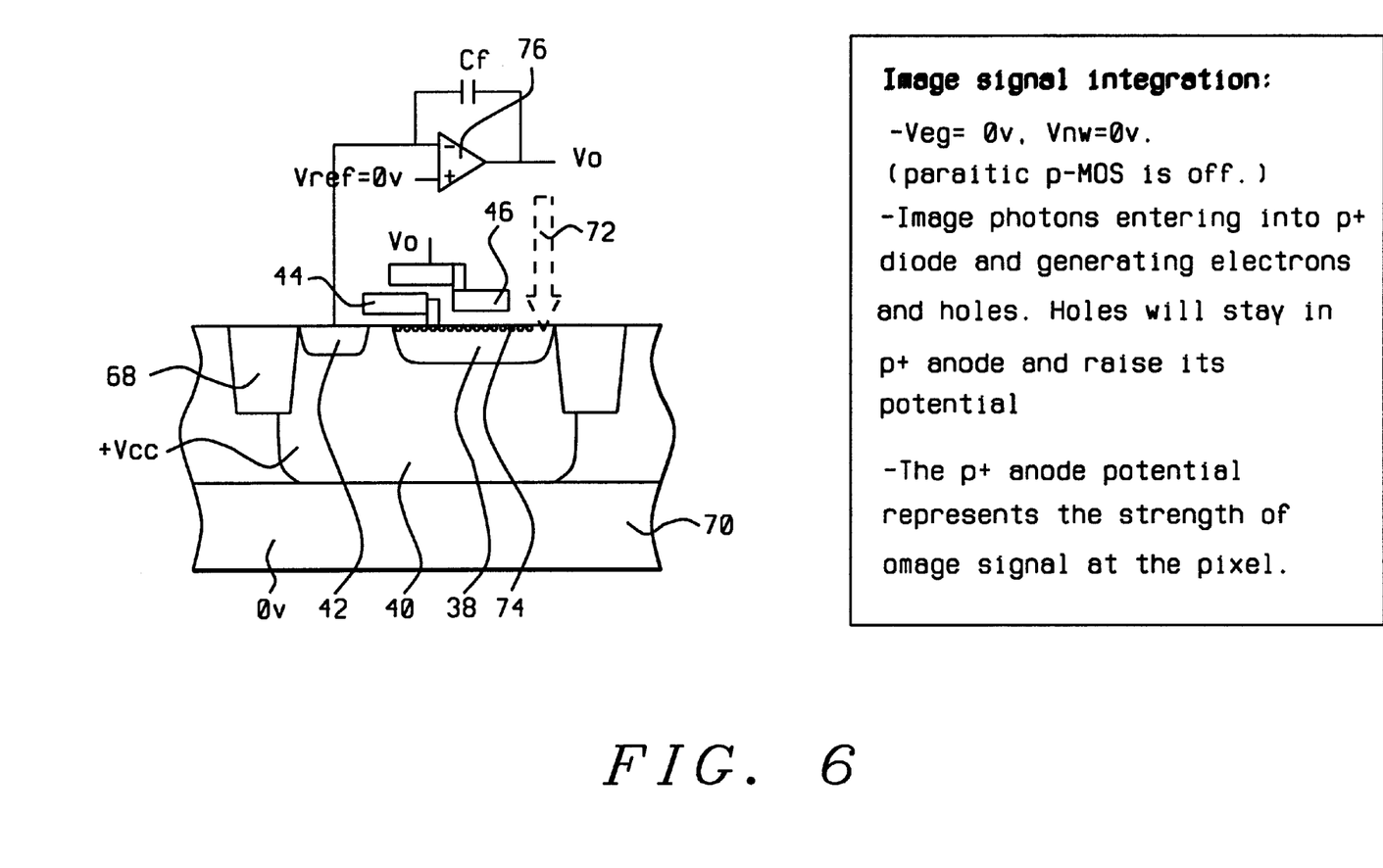
FIGS. 6, 7, 8a and 8b illustrate the image signal integration and read operations.

As described previously, the pixel starts integrating image light after $V_{cg}$ and $V_{nw}$ are pulsed to 0 volts and all the p+ node potentials of the row are at $-0.5 V_{cc}$ at the beginning of image integration. As shown in FIG. 6, image photons, 72 incident onto the photo-diode will generate electron-hole pairs and modulate its potential. Holes, 74 are accumulated in the p+ node of photo-diode and increase the potential of the p+ node, 38 and also of the connected floating-gate, 44 that is shorted to the p+ node and is thus at the same potential. Electrons are depleted by the n-well, 40, which is biased at 0 v. Under very strong image light, the potential of the p+ node will continuously increase until the p+/n-well junction is forward-biased, i.e. when the p+ node potential is clamped at slightly higher than about 0 volts. Therefore, the photo-diode can automatically direct "overflow image photo-current" into n-well and thus eliminate the blooming problem. In short, the "dynamic" range of the p+ node potential is from $-0.5 V_{cc}$ to about 0.3 volts (i.e. slightly forward biased photodiode) during image integration.

Figure 7:
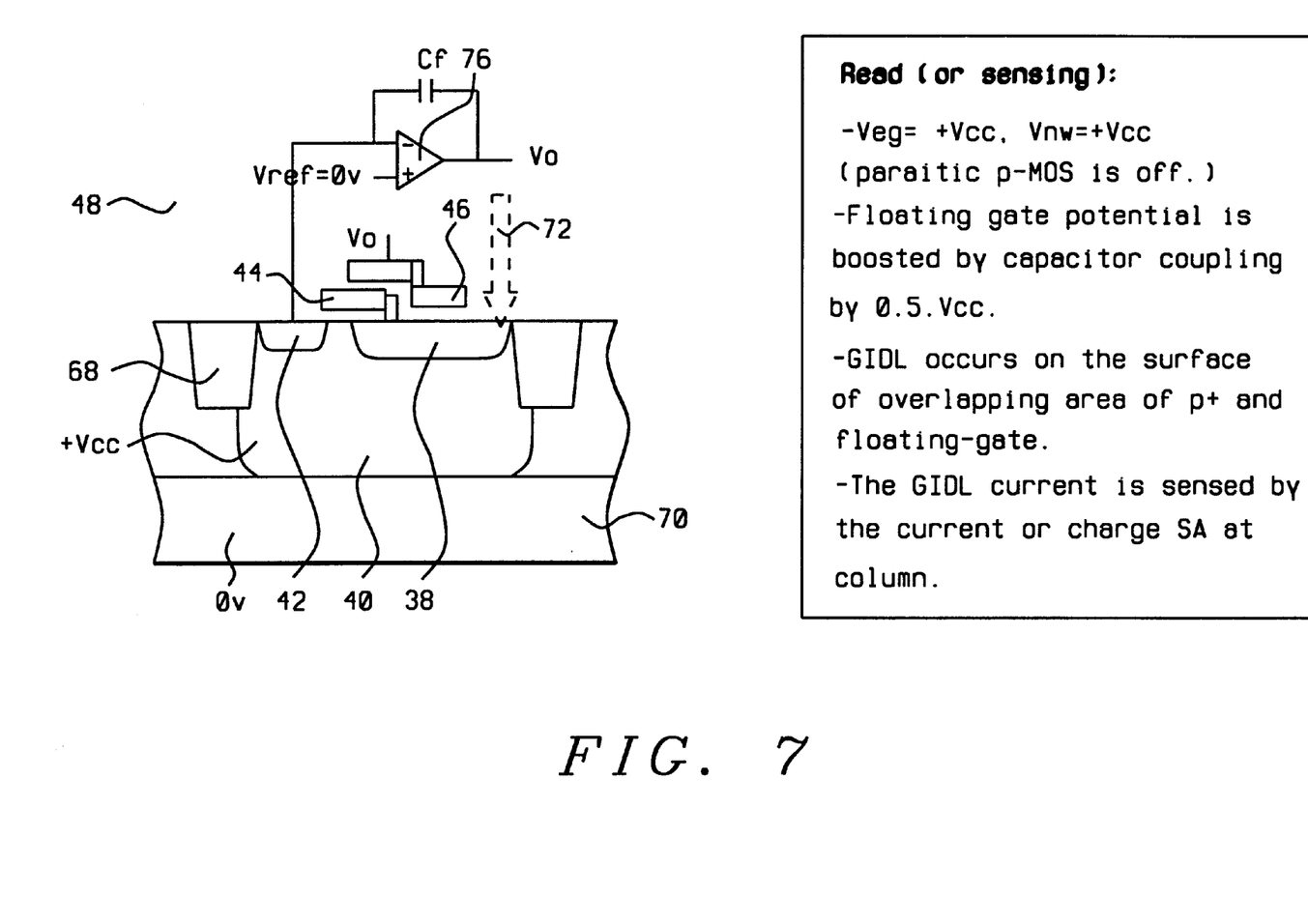

The read, or sensing, operation is shown in FIG. 7. It starts when the control-gate, 46 is pulsed high to $+V_{cc}$. The n-well, 40 is also pulsed high to $+V_{cc}$, but about 1 μs earlier than the control-gate in order to avoid momentarily forward-biasing the p+/n-well photo-diode and the ensuing loss of the p+ node potential. The potential of the floating-gate, and thus also the floating p+ node of the photo-diode, will now be boosted by $\gamma V_{cc}$ (i.e. $+0.5 V_{cc}$) by the capacitative coupling with the control-gate. The p+ node potential, and also that of the floating-gate, is in the range of 0 v (low image light) to $+0.5 V_{cc}$ (high image intensity).

Figure 8A:
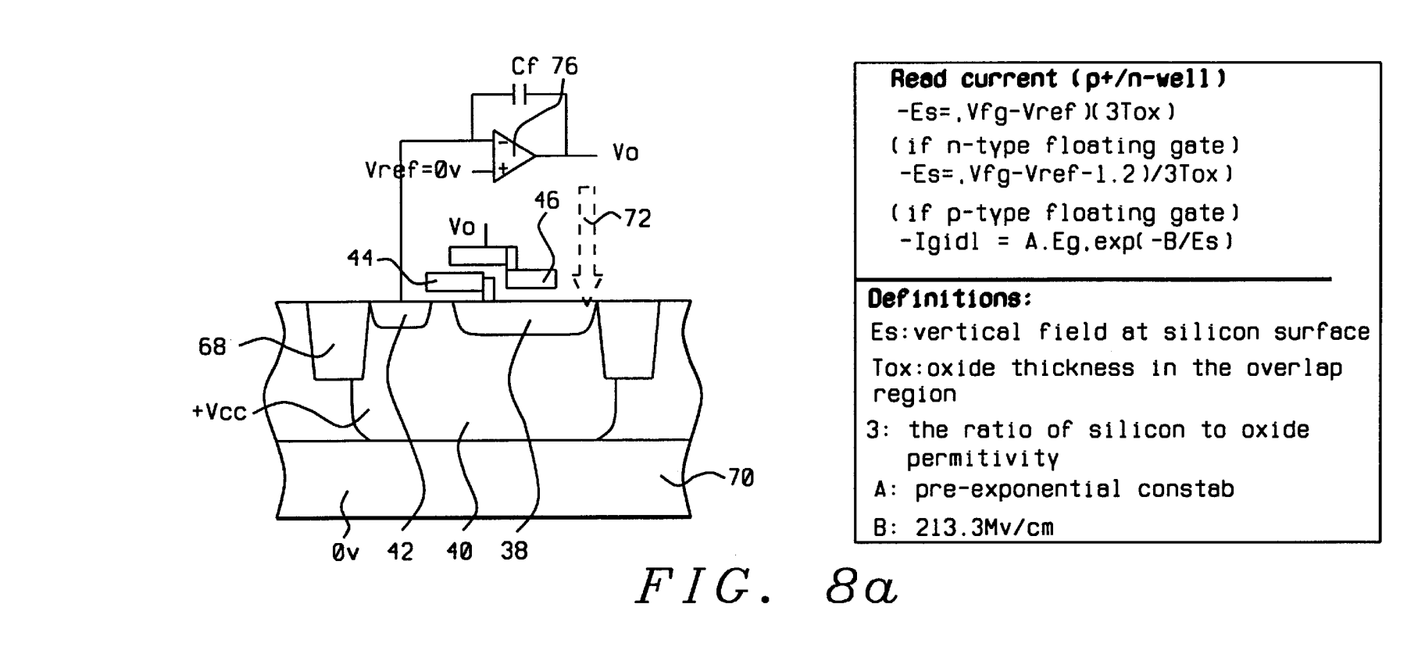
Figure 8B:
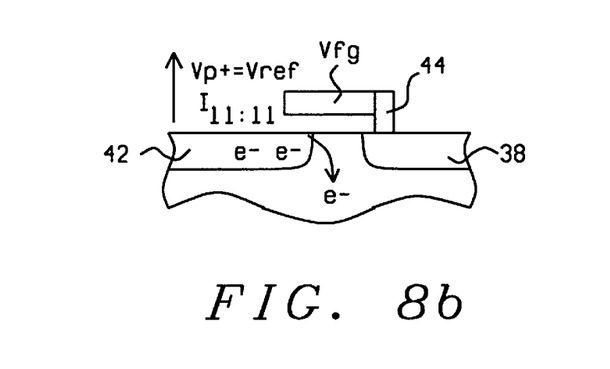

The read, or sensing, mechanism based on GIDL generation is shown in FIGS. 8a and 8b. FIG. 8b magnifies the region 78 of FIG. 8a to more clearly indicate the processes involved in the read operation. Electrons may be generated on the surface of the p+ region, 42, of the output diode, underneath the n-type doped floating-gate by the "band-to-band tunneling" mechanism, if the vertical field ($E_s$) at surface of the p+ region, 42, in the overlap region is large enough. Those electrons will flow into the n-well, 40, (biased at $V_{cc}$) and form the electron "GIDL" current ($I_{gidl}$). The magnitude of $I_{gidl}$ is exponentially modulated by the electrical field $E_s$ and therefore also by the floating-gate potential. As shown in FIG. 8, $E_s$ for an n-type floating-gate, 44, is greater than if the floating gate is p-type. This is due to the effect of poly gate doping type on GIDL current, an effect which is discussed by Lindert et al. Therefor an n-type doped poly floating-gate is preferred. The electrical field $E_s$ with an n-type floating-gate over the p+ region of the output diode is expressed by $E_s=(V_{fg}-V_{ref})/(3T_{ox})$, where $T_{ox}$ is the oxide thickness in the overlap region, $V_{fg}$ is the potential of the floating gate and 3 is the ratio of silicon to oxide permittivity. The potential of the p+ region of the output diode is clamped by the sense amplifier's, 76, reference voltage ($V_{ref}$). The pixel GIDL current ($I_{gidl}$) flows toward the sense amplifier (SA) during read and it is an exponential function of $E_s$, i.e. $I_{gidl}=A.E_s.\exp(-B/E_s)$, where A is a pre-exponential constant, and B=213.3Mv/cm. The SA can either measure the magnitude of current or total charge in read period.

The new pixel offers capability of exponential response, arising from the exponential dependence of $I_{gidl}$ on the floating-gate potential or $E_s$. Therefore the new pixel can be especially useful as a special purpose imager, such as for low-light imaging, defect detection, star tracking or bright light imaging, etc. So far, most prior art pixels have linear response or logarithmic response.

There are several unique features in the new pixel. First, it is preferred for the doping of the floating-gate to be n-type. One reason is that the GIDL current is enhanced as a consequence. The internal field at the surface of the p+ output diode is increased when the floating gate is n-type, as if an additional silicon bandgap voltage (i.e. about 1.1 volts) were applied. This affect is discussed by Lindert et al. Another motivation is that n-type doping of the floating-gate can result in an increase in the magnitude of the threshold voltage of the parasitic p-MOS (from the p+ region of the output diode, 42, to the p+ region of the photo-diode, 38). This increase is large enough so that the p+ areas underneath the floating-gate within the pixel are well isolated under all operating conditions. Second, the doping of the control-gate is preferred to be p-type. The parasitic p-MOS in between p+ nodes, 38, of successive photo-diodes in a row will thus have a low enough threshold voltage (e.g. −0.5 v). Third, the LDD implant structures on the p+ regions, 38 and 42, and spacer structure at the floating-gate edge are preferred to be omitted, so that the GIDL current is enhanced. Thus, one additional non-critical masking step is needed to remove the LDD spacer. Fourth, the p+ node of the photo-diode should not have silicide, which would block the image light. Thus, one additional non-critical masking step is used for silicide blocking. Note that the p+ output diode should not have silicide either, since a silicided junction eliminates the band-to-band tunneling and therefor the GIDL. However, metal layers should shield the p+ output diode. Fifth, since the n-well can be individually organized into rows, each row's n-well may be individually pulsed for enhancement of the pixel dynamic range. In a preferred embodiment of the new pixel of the invention, the dynamic range is ~0.5$V_{cc}$, which is about the same as conventional CMOS pixels.

Sixth, one control-gate can switch basic pixel operations among reset, integration, and read by pulsing to −$V_{cc}$, 0 v, and +$V_{cc}$, respectively. This results in a smaller pixel or a larger fill-factor of the photo-diode area.

Figure 9:
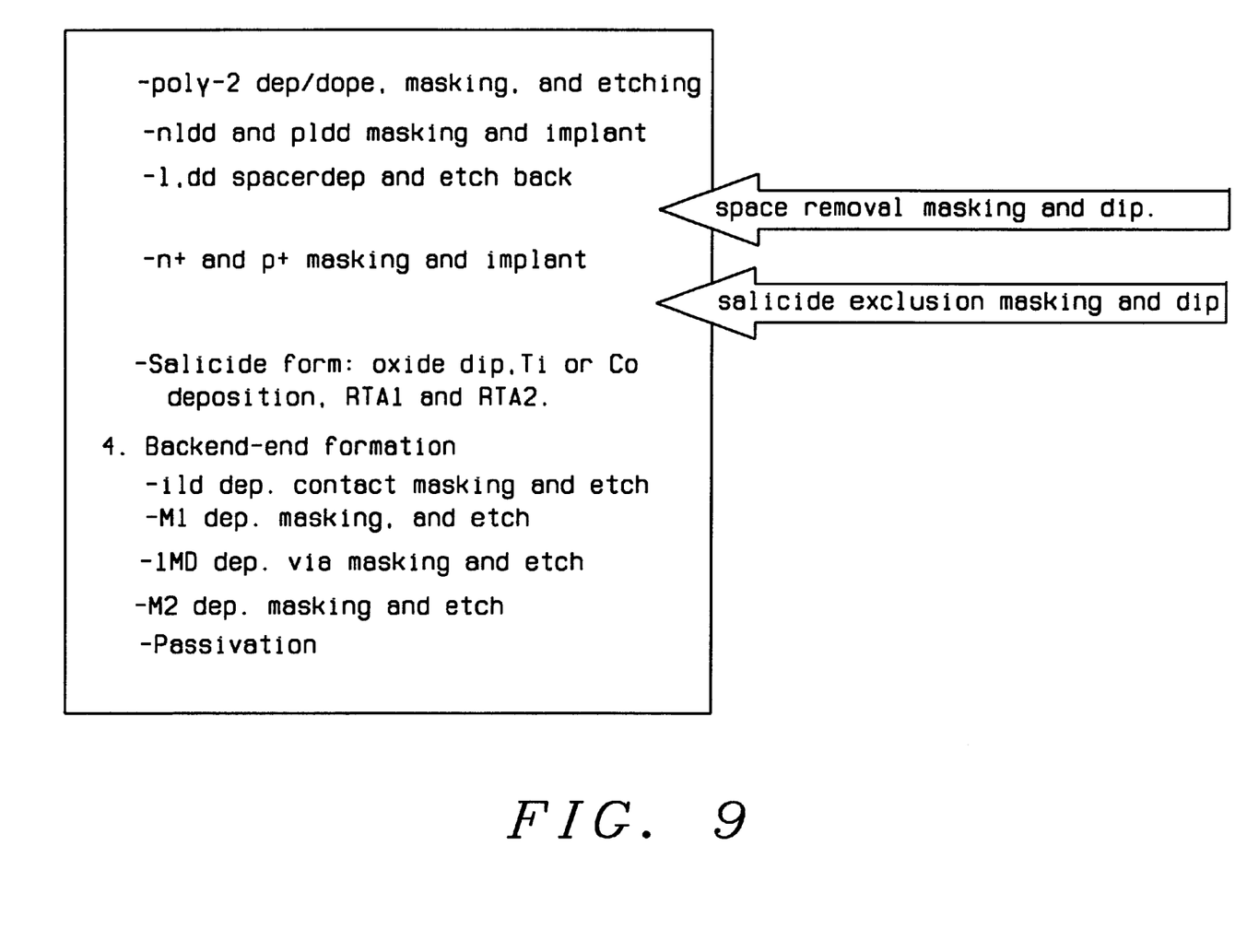
FIG. 9 shows a typical conventional CMOS process flow and a process flow according to the invention, indicating their compatibility.

The process flow is compatible with that typical of CMOS with dual-gate doping (e.g. 0.25 micrometer and beyond). There are four extra masking steps: buried contact formation, floating-gate patterning, removal of spacer along the edge of the floating-gate over the output diode, and silicide exclusion of the photo diode. All other steps are identical to CMOS process flow as shown in FIG. 9. The pixel buried contact is formed by first using a masking step and oxide dip to open a window on the p+ photodiode area, followed by poly-1 (n-doped) layer deposition and patterning (by masking and etching). The buried contact shorts the floating-gate to the p+ photodiode.

A preferred embodiment of the invention is achieved if instead of an n-well in a p-substrate an n-substrate is used. Other preferred embodiments of the invention are realized by reversing the polarity of the doping in the semiconductor regions, the floating gate and the control gate. Thus, with an n-substrate, or a deep n-well in a p-substrate, as extended n-type region, a p-well is formed in the extended n-region. A larger n+ region formed within the p-well below the surface photodiode gives rise to the n+/p-well junction of the photodiode. Similarly, a smaller n+ region gives rise to the n+/p-well junction of the output diode. The floating gate is preferably doped p-type for these embodiments, and the control gate is preferably doped n-type. Changing n to p and p to n in FIG. 3, then that figure would depict these embodiments. These new pixels function similarly as the new pixel described in detail above, but with appropriate voltage polarity reversals as is clear to those versed in the art.

While the invention has been particularly shown and described with reference to the preferred embodiments thereof, it will be understood by those skilled in the art that various changes in form and detail may be made without departing from the spirit and scope of the invention.

What is claimed is:

1. A new active pixel sensor cell formed in a semiconductor substrate comprising:

an n-type region in the substrate extending to a surface of said substrate, two p+ regions formed in said n-type region both extending to the surface of said substrate, covering almost all the active area of the new active pixel sensor cell, and with one of the p+ regions forming the p+ node of the photodiode having a substantially larger surface area than the other p+ region forming the p+ node of the output diode;

isolation regions formed over those portions of the new active pixel cell periphery that will not be adjacent to other new active pixel sensor cells;

a first dielectric layer over the surface of said n-type region;

a first polysilicon layer over the first dielectric layer to form a floating gate that overlaps portions of both the said p+ regions, the floating gate is connected to said photodiode p+ region by a conducting region passing through the first dielectric layer;

a second blanket dielectric layer disposed over said first polysilicon layer, said first dielectric layer and said isolation regions;

a second polysilicon layer to form a control gate that is disposed over the photodiode p+ region and over said floating gate;

a third blanket dielectric layer disposed over said second polysilicon layer and said second dielectric layer;

a metal layer, disposed over the third dielectric layer, is connected to the output diode p+ region by a conductive region passing through the dielectric layers.

2. The structure of claim 1 wherein the semiconductor substrate is a p-substrate and said n-type region is an n-well.

3. The structure of claim 1 wherein the semiconductor substrate is a n-substrate and said n-type region is a region of the n-substrate or said n-type region is an n-well formed within a more extensive p-well formed in the n-substrate.

4. The structure of claim 1 wherein the size of the active area of the new active pixel sensor cell is about 4 micrometers by 4 micrometers, the photodiode area is about 85% of the active area and the output diode about 12%.

5. The structure of claim 1 wherein said isolation regions are shallow trench isolation regions.

6. The structure of claim 1 wherein said isolation regions are field oxide isolation regions.

7. The structure of claim 1 wherein said first dielectric layer is a silicon oxide, silicon nitride or silicon oxynitride layer.

8. The structure of claim 1 wherein the effective thickness with respect to oxide of said first dielectric layer is between about 20 to about 100 angstroms.

9. The structure of claim 1 wherein said floating gate is n-type polysilicon.

10. The structure of claim 1 wherein said control gate is p-type polysilicon.

11. The structure of claim 1 wherein said second dielectric layer is a silicon oxide, silicon nitride or silicon oxynitride layer.

12. The structure of claim 1 wherein the oxide effective thickness of said second dielectric layer is between about 40 to about 100 angstroms.

13. The structure of claim 1 wherein said third dielectric layer is a silicon oxide, silicon nitride or silicon oxynitride layer.

14. The structure of claim 1 wherein the oxide effective thickness of said third dielectric layer is between about 20 to about 100 angstroms.

15. A new active pixel sensor cell formed in a semiconductor substrate comprising:

a p-type region in the substrate extending to a surface of said substrate, two n+ regions formed in said p-type region both extending to the surface of said substrate, covering almost all the active area of the new active pixel sensor cell, and with one of the n+ regions forming the n+ node of the photodiode having a substantially larger surface area than the other n+ region forming the n+ node of the output diode;

isolation regions formed over those portions of the new active pixel cell periphery that will not be adjacent to other new active pixel sensor cells;

a first dielectric layer over the surface of said p-type region;

a first polysilicon layer over the first dielectric layer to form a floating gate that overlaps portions of both the said n+ regions, the floating gate is connected to said photodiode n+ region by a conducting region passing through the first dielectric layer;

a second blanket dielectric layer disposed over said first polysilicon layer, said first dielectric layer and said isolation regions;

a second polysilicon layer to form a control gate that is disposed over the photodiode p+ region and over said floating gate;

a third blanket dielectric layer disposed over said second polysilicon layer and said second dielectric layer;

a metal layer, disposed over the third dielectric layer, is connected to the output diode n+ region by a conductive region passing through the dielectric layers.

16. The structure of claim 15 wherein the semiconductor substrate is an n-substrate and said p-type region is a p-well.

17. The structure of claim 15 wherein the semiconductor substrate is a p-substrate and said p-type region is a region of the p-substrate or said p-type region is a p-well formed within a more extensive n-well formed in the p-substrate.

18. The structure of claim 15 wherein the size of the active area of the new active pixel sensor cell is about 4 micrometers by 4 micrometers, the photodiode area is about 85% of the active area and the output diode about 12%.

19. The structure of claim 15 wherein said isolation regions are shallow trench isolation regions.

20. The structure of claim 15 wherein said isolation regions are field oxide isolation regions.

21. The structure of claim 15 wherein said first dielectric layer is a silicon oxide, silicon nitride or silicon oxynitride layer.

22. The structure of claim 15 wherein the oxide effective thickness of said first dielectric layer is between about 20 to about 100 angstroms.

23. The structure of claim 15 wherein said floating gate is p-type polysilicon.

24. The structure of claim 15 wherein said control gate is n-type polysilicon.

25. The structure of claim 15 wherein said second dielectric layer is a silicon oxide, silicon nitride or silicon oxynitride layer.

26. The structure of claim 15 wherein the oxide effective thickness of said second dielectric layer is between about 40 to about 100 angstroms.

27. The structure of claim 15 wherein said third dielectric layer is a silicon oxide, silicon nitride or silicon oxynitride layer.

28. The structure of claim 15 wherein the oxide effective thickness of said third dielectric layer is between about 20 to about 80 angstroms.

29. A method of operating a new active pixel sensor cell formed in a semiconductor substrate, the new active pixel sensor cell comprising:

an n-type region in the substrate extending to a surface of said substrate, two p+ regions formed in said n-type region both extending to the surface of said substrate, covering almost all the active area of the new active pixel sensor cell, and with one of the p+ regions forming the p+ node of the photodiode having a substantially larger surface area than the other p+ region forming the p+ node of the output diode;

isolation regions formed over those portions of the new active pixel cell periphery that will not be adjacent to other new active pixel sensor cells;

a first dielectric layer over the surface of said n-type region;

a first polysilicon layer over the first dielectric layer to form a floating gate that overlaps portions of both the said p+ regions, the floating gate is connected to said photodiode p+ region by a conducting region passing through the first dielectric layer;

a second blanket dielectric layer disposed over said first polysilicon layer, said first dielectric layer and said isolation regions;

a second polysilicon layer to form a control gate that is disposed over the photodiode p+ region and over said floating gate;

a third blanket dielectric layer disposed over said second polysilicon layer and said second dielectric layer;

a metal layer, disposed over the third dielectric layer, is connected to the output diode p+ region by a conductive region passing through the dielectric layers;

the operating method comprising:

determining the frame period as the inverse of the number of frames per second desired, resetting the new active pixel sensor cell by applying a potential $-V_{cc}$ to the control gate and $+V_{cc}$ to the n-type region for the duration of the reset portion of the frame period, integrating charge produced by the image light during the image integration portion of the frame period, at which time the control gate and the n-type region are at 0 volts, reading the integrated charge, produced by the image light during the image integration portion of the frame period, during the read portion of the frame period, at which time both the control gate and n-type region are at $V_{cc}$, with the n region having been pulsed to $V_{cc}$ earlier than the control gate and the read operation is accomplished by sensing the GIDL current passing out of the output diode, performing said reset, image integration and read operation for ensuing frames.

30. The method of claim 29 wherein said frame period is between about 10 to about 84 milliseconds.

31. The method of claim 29 wherein said reset portion of the frame period is between about 0.01 to about 1 milliseconds.

32. The method of claim 29 wherein said image integration portion of the frame period is between about 10 to about 81 milliseconds.

33. The method of claim 29 wherein said read portion of the frame period is between about 1 to about 100 microseconds.

34. The method of claim 29 wherein $V_{cc}$ is between about 2.0 to about 3.3 volts.

35. A method of operating a new active pixel sensor cell formed in a semiconductor substrate, the new active pixel sensor cell comprising:

a p-type region in the substrate extending to a surface of said substrate, two n+ regions formed in said p-type region both extending to the surface of said substrate, covering almost all the active area of the new active pixel sensor cell, and with one of the n+ regions forming the n+ node of the photo-diode having a substantially larger surface area than the other n+ region forming the n+ node of the output diode;

isolation regions formed over those portions of the new active pixel cell periphery that will not be adjacent to other new active pixel sensor cells;

a first dielectric layer over the surface of said p-type region;

a first polysilicon layer over the first dielectric layer to form a floating gate that overlaps portions of both the said n+ regions, the floating gate is connected to said photodiode n+ region by a conducting region passing through the first dielectric layer;

a second blanket dielectric layer disposed over said first polysilicon layer, said first dielectric layer and said isolation regions;

a second polysilicon layer to form a control gate that is disposed over the photodiode p+ region and over said floating gate;

a third blanket dielectric layer disposed over said second polysilicon layer and said second dielectric layer;

a metal layer, disposed over the third dielectric layer, is connected to the output diode n+ region by a conductive region passing through the dielectric layers;

the operating method comprising:

determining the frame period as the inverse of the number of frames per second desired, resetting the new active pixel sensor cell by applying a potential $+V_{cc}$ to the control gate and $-V_{cc}$ to the p-type region for the duration of the reset portion of the frame period, integrating charge produced by the image light during the image integration portion of the frame period, at which time the control gate and the p-type region are at 0 volts, reading the integrated charge, produced by the image light during the image integration portion of the frame period, during the read portion of the frame period, at which time both the control gate and p-type region are at $-V_{cc}$ with the p-type region having been pulsed to $V_{cc}$, earlier than the control gate and the read operation is accomplished by sensing the GIDL current passing out of the output diode, performing said reset, image integration and read operation for ensuing frames.

36. The method of claim 35 wherein said frame period is between about 10 to about 84 milliseconds.

37. The method of claim 35 wherein said reset portion of the frame period is between about 0.01 to about 1 milliseconds.

38. The method of claim 35 wherein said image integration portion of the frame period is between about 10 to about 81 milliseconds.

39. The method of claim 35 wherein said read portion of the frame period is between about 1 to about 100 microseconds.

40. The method of claim 35 wherein $V_{cc}$ is between about 2 to about 3.3 volts.

41. An array of new active pixel sensor cells formed in a semiconductor substrate comprising:

an n-type region in the substrate extending to the surface and common to the new active pixel cells of a row, two p+ regions formed in said n-type region, for each new active pixel sensor cell, both extending to the surface, covering almost all the active area of the new active pixel sensor cell, and with one of the p+ regions forming a p+ node of the photo-diode having a substantially larger surface area than an other p+ region forming a p+ node of an output diode, and for each row an edge p+ junction formed at the edge of the row's n-type region;

isolation regions formed over those portions of the new active pixel cell periphery that will not be adjacent to neighboring new active pixel sensor cells of the row;

a first dielectric layer over the surface of said n-type region;

a first polysilicon layer over the first dielectric layer to form, for each new active pixel sensor cell, a floating gate that overlaps portions of both the said p+ regions, the floating gate is connected to photodiode p+ region by a conducting region passing through the first dielectric layer, a second blanket dielectric layer disposed over said first polysilicon layer, said first dielectric layer and said isolation regions;

a second polysilicon layer to form, for each row, a row control gate that is disposed over the photodiode p+ regions, and over said floating gates, and the part of the row control gate of each new active pixel sensor cell being connected to that of its neighbors and the row control gate overlaps the row edge p+ junction;

a third dielectric layer disposed over said second dielectric layer and said second polysilicon layer;

a column metal layer, disposed over the third dielectric layer, is connected to corresponding output diode p+ regions of each row by conductive regions passing through the dielectric layers.

42. The structure of claim 41 wherein the semiconductor substrate is a p-substrate and said n-type region is an n-well.

43. The structure of claim 41 wherein the semiconductor substrate is a n-substrate and said n-type region is a region of the n-substrate or said n-type region is an n-well formed within a more extensive p-well formed in the n-substrate.

44. The structure of claim 41 wherein the size of the active area of the new active pixel sensor cell is about 4 micrometers by 4 micrometers, the photodiode area is about 85% of the active area and the output diode about 12%.

45. The structure of claim 41 wherein said isolation regions are shallow trench isolation regions.

46. The structure of claim 41 wherein said isolation regions are field oxide isolation regions.

47. The structure of claim 41 wherein said first dielectric layer is a silicon oxide, silicon nitride or silicon oxynitride layer.

48. The structure of claim 41 wherein the oxide effective thickness of said first dielectric layer is between about 20 to about 100 angstroms.

49. The structure of claim 41 wherein said floating gate is n-type polysilicon.

50. The structure of claim 41 wherein said row control gate is p-type polysilicon.

51. The structure of claim 41 wherein said second dielectric layer is a silicon oxide, silicon nitride or silicon oxynitride layer.

52. The structure of claim 41 wherein the oxide effective thickness of said second dielectric layer is between about 40 to about 100 angstroms.

53. The structure of claim 41 wherein said third dielectric layer is a silicon oxide, silicon nitride or silicon oxynitride layer.

54. The structure of claim 41 wherein the oxide effective thickness of said third dielectric layer is between about 20 to about 100 angstroms.

55. An array of new active pixel sensor cells formed in a semiconductor substrate comprising:

a p-type region in the substrate extending to the surface and common to the new active pixel cells of a row, two n+ regions formed in said p-type region, for each new active pixel sensor cell, both extending to the surface, covering almost all the active area of the new active pixel sensor cell, and with one of the n+ regions forming a n+ node of the photo-diode having a substantially larger surface area than an other n+ region forming an n+ node of an output diode, and for each row an edge n+ junction formed at the edge of the row's p-type region;

isolation regions formed over those portions of the new active pixel cell periphery that will not be adjacent to neighboring new active pixel sensor cells of the row;

a first dielectric layer over the surface of said p-type region;

a first polysilicon layer over the first dielectric layer to form, for each new active pixel sensor cell, a floating gate that overlaps portions of both the said n+ regions, the floating gate is connected to photodiode n+ region by a conducting region passing through the first dielectric layer, a second blanket dielectric layer disposed over said first polysilicon layer, said first dielectric layer and said isolation regions;

a second polysilicon layer to form, for each row, a row control gate that is disposed over the photodiode n+ regions, and over said floating gates, and the part of the row control gate of each new active pixel sensor cell being connected to that of its neighbors and the row control gate overlaps the row edge n+ junction;

a third dielectric layer disposed over said second dielectric layer and said second polysilicon layer;

a column metal layer, disposed over the third dielectric layer, is connected to corresponding output diode n+ regions of each row by conductive regions passing through the dielectric layers.

56. The structure of claim 55 wherein the semiconductor substrate is a p-substrate and said n-type region is an n-well.

57. The structure of claim 55 wherein the semiconductor substrate is a n-substrate and said n-type region is a region of the n-substrate or said n-type region is an n-well formed within a more extensive p-well formed in the n-substrate.

58. The structure of claim 55 wherein the size of the active area of the new active pixel sensor cell is about 4 micrometers by 4 micrometers, the photodiode area is about 85% of the active area and the output diode about 12%.

59. The structure of claim 55 wherein said isolation regions are shallow trench isolation regions.

60. The structure of claim 55 wherein said isolation regions are field oxide isolation regions.

61. The structure of claim 55 wherein said first dielectric layer is a silicon oxide, silicon nitride or silicon oxynitride layer.

62. The structure of claim 55 wherein the oxide effective thickness of said first dielectric layer is between about 20 to about 100 angstroms.

63. The structure of claim 55 wherein said floating gate is n-type polysilicon.

64. The structure of claim 55 wherein said row control gate is p-type polysilicon.

65. The structure of claim 55 wherein said second dielectric layer is a silicon oxide, silicon nitride or silicon oxynitride layer.

66. The structure of claim 55 wherein the oxide effective thickness of said second dielectric layer is between about 40 to about 100 angstroms.

67. The structure of claim 55 wherein said third dielectric layer is a silicon oxide, silicon nitride or silicon oxynitride layer.

68. The structure of claim 55 wherein the oxide effective thickness of said third dielectric layer is between about 20 to about 100 angstroms.

* * * * *